(12) United States Patent
Itkin et al.

(10) Patent No.: US 7,453,321 B2
(45) Date of Patent: Nov. 18, 2008

(54) AMPLIFIER ARRANGEMENT AND METHOD OF SIGNAL AMPLIFICATION

(75) Inventors: Grigory Itkin, München (DE); Viktor Gromorushkin, Moscow (RU); Igor Chugunov, Moscow (RU)

(73) Assignee: Infineon Technologies AG, Munich (DE)

( * ) Notice: Subject to any disclaimer, the term of this patent is extended or adjusted under 35 U.S.C. 154(b) by 117 days.

(21) Appl. No.: 11/482,921

(22) Filed: Jul. 7, 2006

(65) Prior Publication Data
US 2007/0018729 A1    Jan. 25, 2007

(30) Foreign Application Priority Data
Jul. 8, 2005    (DE)    ........................ 10 2005 032 093

(51) Int. Cl.
*H03F 1/191* (2006.01)
*H03F 1/14* (2006.01)
(52) U.S. Cl. .......................................... 330/302; 330/51
(58) Field of Classification Search .................. 330/51, 330/144, 284, 302
See application file for complete search history.

(56) References Cited

U.S. PATENT DOCUMENTS 5,060,294 A * 10/1991 Schwent et al. ............... 330/51
6,281,748 B1    8/2001 Klomsdorf et al.
6,794,935 B2    9/2004 Klomsdorf et al.
7,202,736 B1 *  4/2007 Dow et al. .................. 330/302

FOREIGN PATENT DOCUMENTS

DE    199 30 195 A1    1/2001

* cited by examiner

*Primary Examiner*—Khanh V Nguyen
(74) *Attorney, Agent, or Firm*—Eschweiler & Associates, LLC

(57) ABSTRACT

An amplifier arrangement is proposed which has an amplifier with adjustable amplification having an output. An impedance transformer circuit is connected to the output. Said circuit is designed for transforming a high output impedance of the adjustable amplifier into a low impedance at its output. The amplifier arrangement contains at least two switchable elements having a reactance, which elements are connected in each case by a first terminal to the output of the impedance transformer circuit, and by a second terminal to a reference potential terminal. The switchable elements are designed for changing the impedance at the output of the impedance transformer circuit depending on a switch position of a switching means. A load impedance at the output of the amplifier is consequently varied by simple means when the output level of the amplifier changes.

12 Claims, 3 Drawing Sheets

AMPLIFIER ARRANGEMENT AND METHOD OF SIGNAL AMPLIFICATION

REFERENCE TO RELATED APPLICATIONS

This application claims the benefit of the priority date of German application DE 10 2005 032 093.7, filed on Jul. 8, 2005, the contents of which are herein incorporated by reference in their entirety.

FIELD OF THE INVENTION

The present invention relates to an amplifier arrangement. The invention furthermore relates to a method of signal amplification.

BACKGROUND OF THE INVENTION

Power amplifiers that have a low power consumption while at the same time being highly efficient are required within the transmission path in mobile communication devices, in particular at the output of the transmission path. The power amplifiers should be able to amplify both signals having a substantially constant envelope and signals having a variable envelope. Signals having a constant amplitude or envelope respectively are used, inter alia, in the Bluetooth and GSM mobile communication standards. Signals in which the information to be transmitted is encoded in both the phase and in the amplitude are known for example from the mobile communication standards EDGE, UMTS/WCDMA and all WLAN standards.

In order to meet the various needs, it is possible to provide different power amplifiers optimized for the different mobile communication standards. However, the increasing integration density and the need to occupy less space while at the same time reducing power consumption would appear to necessitate the use of just one power amplifier for a multiplicity of possible mobile communication standards.

In a conventional amplifier that can be used for a plurality of different modulated signals, a variable load having a number of capacitors is connected downstream of the amplifier. Said capacitors are connected firstly to the output of the amplifier and also to a reference potential terminal. If the output power is high, the individual capacitive elements are activated, thus changing the load across the amplifier.

In the embodiment shown in the publication, however, part of this power is lost via the switching elements for connecting or disconnecting the individual capacitances, particularly if the output power is high. The amplifier consequently has to provide a higher output power. Moreover, the switches designed for a high output power require a relatively large chip area, resulting in an increase in the overall space required.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

According to one embodiment of the invention, an amplifier with adjustable amplification having an output for outputting a signal is provided. A means for changing the impedance is connected on its input side to the output of the amplifier and is designed for changing an output impedance of the adjustable amplifier into an impedance at the output of the means for changing the impedance. In addition, at least one means comprising a reactance is connected in a switchable manner to the output of the means for changing the impedance. By virtue of the amplifier arrangement according to the invention, the power consumption with respect to the different output power values is reduced. Moreover, it is possible using simple means to achieve signal amplification at the same time as a relatively low power consumption.

In one embodiment of the invention, the amplifier arrangement comprises an amplifier with adjustable amplification having an output for outputting a signal. An impedance transformer circuit is connected by one input to said output. The impedance transformer circuit is designed for transforming a high output impedance of the adjustable amplifier into a low impedance at the output of the impedance transformer circuit. It thus transforms a low impedance at its output into the high output impedance of the amplifier with adjustable amplification. In another example, the amplifier arrangement may further comprise at least two switchable elements having a reactance. Said elements are connected by a first terminal in each case to the output of the impedance transformer circuit and are connected by a second terminal to a reference potential terminal. They each have a switching means and are designed for changing the impedance at the output of the impedance transformer circuit depending on a switch position of the switching means.

In another embodiment of the invention, the arrangement serves to change the load impedance at the output of the last amplifier stage of a power amplifier. Provided for this purpose is an impedance transformer circuit, the output impedance of which is variable by means of the elements connected to the output of the transformer circuit. In one embodiment of the invention, the switchable elements are designed in such a way that they are connected in parallel with the output impedance of the impedance transformer circuit when an output level of a signal output by the amplifier is reduced.

The circuit illustrated reduces the high-frequency power loss and enables the use of switching means that also work with low power. Moreover, the impedance transformer circuit presented will attain a high level of efficiency in the output stage of the amplifier with adjustable amplification, and consequently the average amplification efficiency will be improved. The term amplification efficiency is understood to be the ratio of power output by the amplifier to the power expended. By increasing the load impedance by means of suitable connection or disconnection of the at least two components, the amplification of the amplifier with adjustable amplification increases, whereby on the one hand a signal input level in the amplifier can be reduced. In addition, the power consumption of the amplifier arrangement can also be reduced, which results in an improvement in operating duration for mobile communication devices in particular.

In a further embodiment of the invention, the amplifier arrangement contains a matching network connected on the input side to the output of the impedance transformer circuit and the at least two switchable elements. It is thus also possible to achieve a matching, for example to an antenna connected to the matching network. In another embodiment of the invention, the at least two elements comprise in each case an inductive component which influences the impedance at the output of the impedance transformer circuit. The use of inductive components as reactance elements enables the realization of Class A or Class AB amplifier stages with a very high amplification efficiency.

In another embodiment of the invention, at least one of the two elements comprises a pin diode, the first terminal of which is connected to the switching means for supplying a potential, and the second terminal of which is connected to a component having the reactance. In one embodiment, the switching means is designed with a transistor comprising a control terminal for supplying a signal for the purpose of switching the element.

In another embodiment, the impedance transformer circuit comprises a first coil, a second coil connected in series, and a capacitive component. Said component is connected by a first terminal between the first and second coil, and by a second terminal to a reference potential.

To the accomplishment of the foregoing and related ends, the invention comprises the features hereinafter fully described and particularly pointed out in the claims.

The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail in the following text using a number of illustrative embodiments and with reference to the drawings, in which.

DETAILED DESCRIPTION OF THE INVENTION

Figure 1:
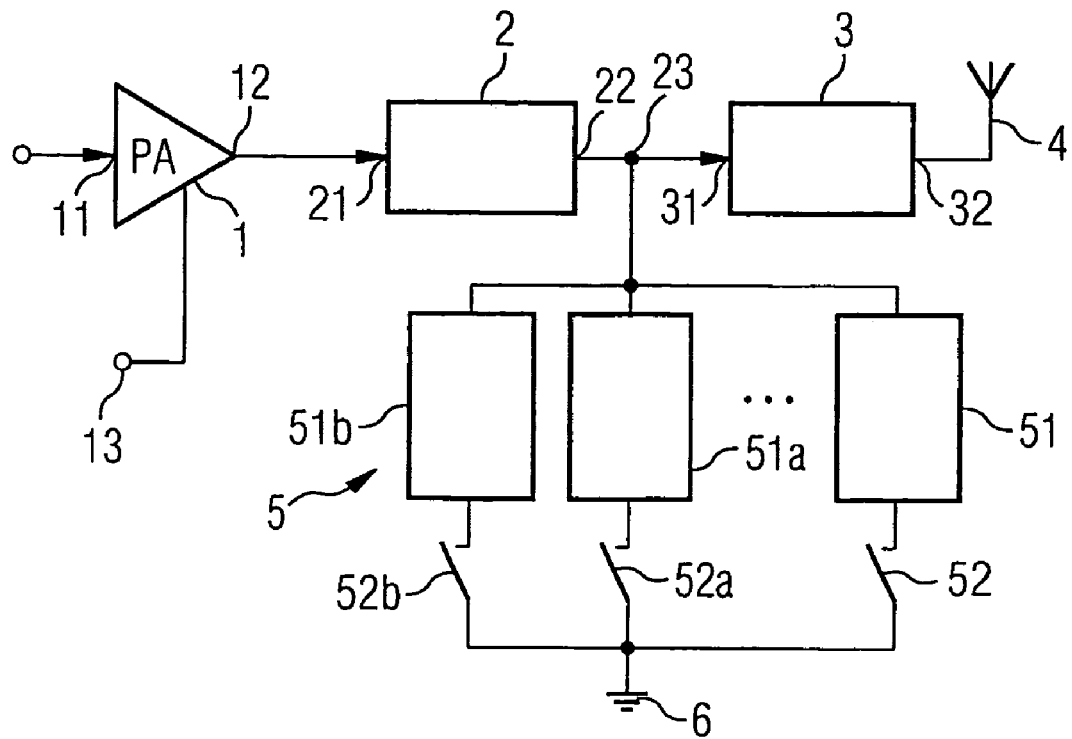
FIG. 1 shows a block circuit diagram according to one embodiment of the invention.

One or more implementations of the present invention will now be described with reference to the attached drawings, wherein like reference numerals are used to refer to like elements throughout, and wherein the illustrated structures are not necessarily drawn to scale.

FIG. 1 shows a block circuit diagram of one embodiment of the invention. The amplifier arrangement illustrated is realized as an integrated circuit in a semiconductor body, not shown here in detail. It contains an amplifier 1 with an input 11 for supplying a signal to be amplified. Said signal is output at the output 12. In addition, the power amplifier 1 has a control terminal 13, to which an actuating signal for setting its amplification can be supplied. The power amplifier 1 sets its average amplification at the control terminal 13 by means of an actuating signal.

The output 12 of the power amplifier 1 is connected to an input 21 of an impedance transformer circuit 2. The impedance transformer circuit 2 transforms a low impedance at its output 22 from a high impedance at the output 12 of the amplifier 1. It consequently transforms a high output impedance of the amplifier 1 into a low output impedance at the output 22. This is also known as impedance inversion. The impedance transformer circuit 2 can thus also be designed as an impedance inverter circuit.

The output 22 of the impedance transformer circuit 2 is connected to an input 31 of a matching network 3. The output 32 of the matching network 3 is connected to an antenna 4 for outputting the amplified signal. The matching network 3 serves to match the input impedance of the antenna 4 to the low output impedance of the impedance transformer circuit 2. This prevents any reflection of the signal output from the power amplifier at the antenna 4.

A plurality of switchable reactance elements 5 are provided to improve the amplifier efficiency, which comprises the ratio of power used to the signal power output by the amplifier 1. Said reactance elements are connected by one terminal in each case to a tap 23 at the output 22 of the impedance transformer circuit. The various elements 5 contain in each case a reactance 51, 51a, 51b as well as switching means 52, 52a, 52b connected thereto.

The term reactance refers in this context to a component which ideally has simply reactive power. In practice, it is a component whose reactive power is very high in relation to a real resistance. The individual switching means 52, 52a, 52b serve to connect the individual reactances 51, 51a, 51b to a reference potential terminal 6, which in the present case provides a ground potential.

By means of the switches 52, 52a and 52b, the reactances 51, 51a, 51b connected thereto can be switched into the signal path, in particular in parallel with the impedance transformer circuit 2. By virtue of this arrangement, the impedance at the output of the transformer circuit is changed by the additionally switched reactance, that is to say is increased or reduced. Which of the respective reactances 51, 51a, 51b is connected or disconnected in each case depends on the power output by the power amplifier 12. In general, in the case of the parallel connection of the reactances 5 with the output 22 of the impedance transformer circuit 2 shown here, the output impedance of the impedance transformer circuit 2 is reduced if the output level of a signal at the output of the amplifier circuit 12 is reduced. By virtue of the parallel arrangement, this can be achieved by connecting the reactances 51, 51a, 51b. Analogously, the impedance at the output increases when reactances are disconnected, which can be achieved by disconnecting the reactances 51, 51a, 51b from the ground potential terminal 6 by opening the switches 52, 52a or 52b.

Figure 2:
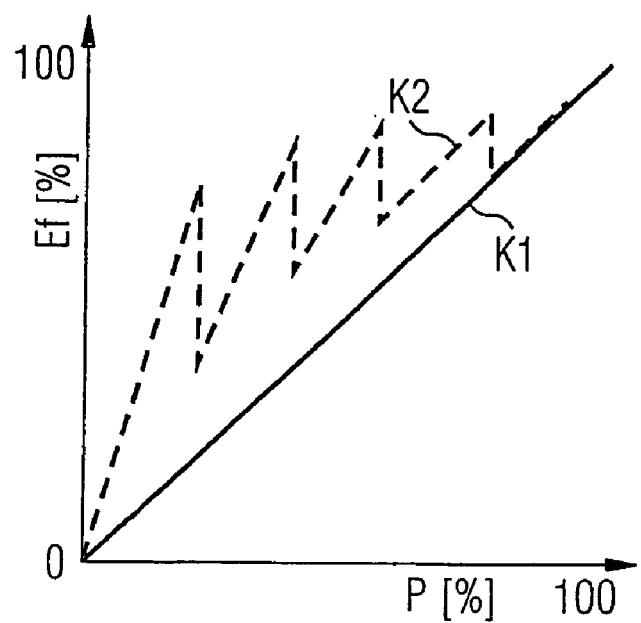
FIG. 2 shows a diagram illustrating the dependency of amplification efficiency on the output power for a linear amplifier with a constant load as well as a variable load according to one embodiment of the invention.

FIG. 2 shows for this purpose a diagram of the efficiency of the power amplifier 1 as a function of the output power P output. The curve K1 shows here a linear amplifier with a constant output load. In contrast, the curve K2 shows an exemplary embodiment of the invention with selectable and switchable reactance elements. A total of four additional switchable elements are provided in the present case. As is evident, the power efficiency drops after each switching operation, but overall remains higher than the efficiency curve of a linear amplifier with a constant load. The two curves K1 and K2 only come into proximity in the case of very high output power in the region of 50%-60%, so that no further improvement can be achieved here.

Figure 3:
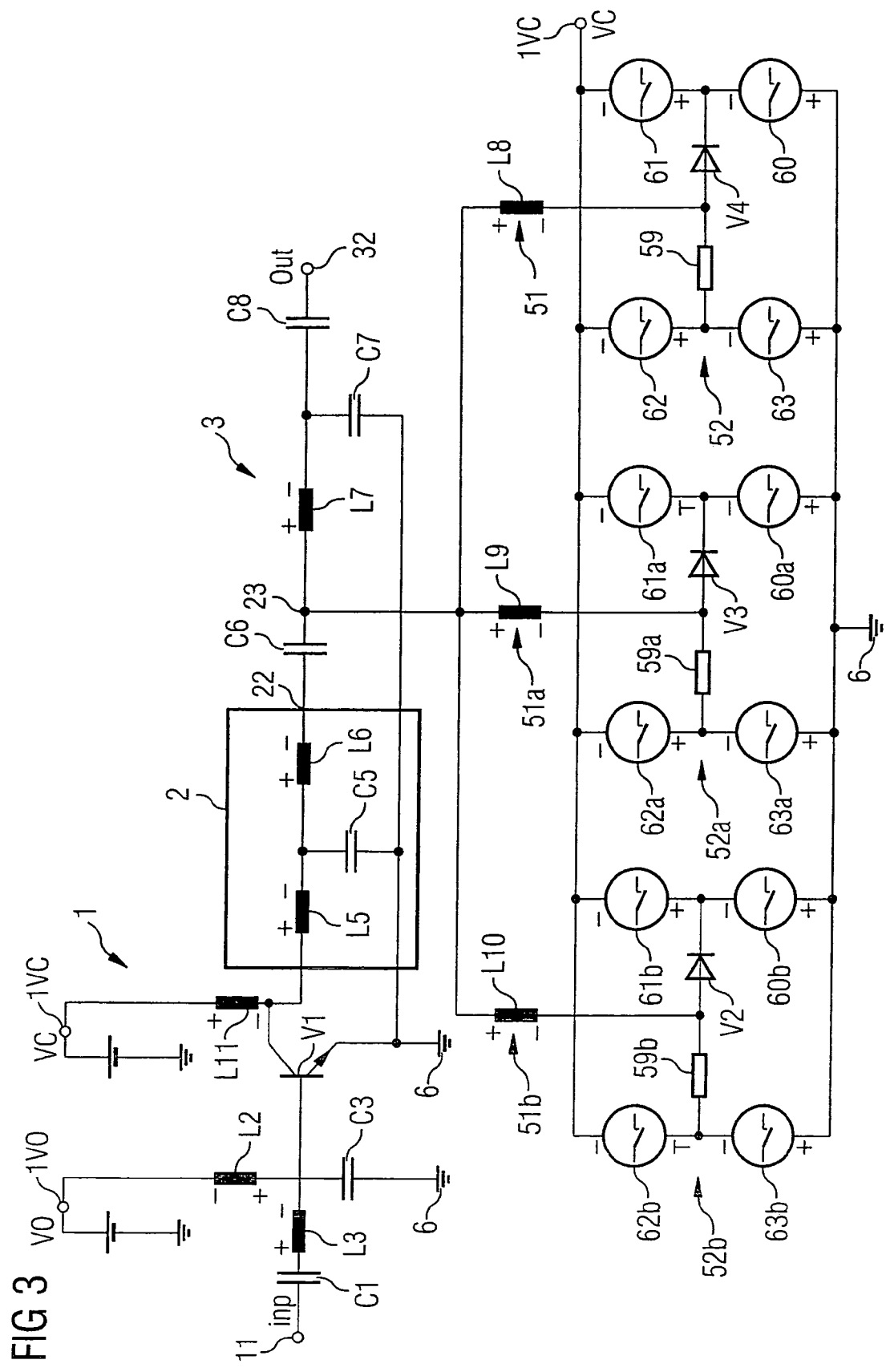
FIG. 3 shows an actual embodiment of the invention.

FIG. 3 shows an actual embodiment of the invention. In this exemplary embodiment, only the output stage of the power amplifier 1 is shown. In detail, the input 11 is connected via a first capacitor C1 and a first coil L3 to the control terminal of a first power transistor V1. Said transistor is designed as an npn bipolar transistor, and is connected to ground potential via its emitter terminal. To adjust the operating point, the control terminal of the bipolar transistor V1 is additionally connected to a terminal 1V0 for supplying a bias potential V0 via a coil L2. Both the coil L2 and the capacitor C1 serve as filters for suppressing high-frequency components or the direct component respectively.

For the purpose of its supply, the power transistor V1 is connected by its collector terminal via a coil L11 to a terminal 1VC for supplying the supply potential VC. At the same time the collector terminal forms the output 12 of the amplifier arrangement 1. In turn the coil L11 serves to suppress high-frequency components, and additionally as a load for decoupling the amplified high-frequency signal.

The impedance transformer circuit 2 comprises two coils L5 and L6 connected in series as well as a capacitor C5 which is connected to a tap between the two coils L5 and L6 as well as to the ground potential terminal 6. In the embodiment illustrated the impedance transformer circuit is realized as a T-quadropole. The capacitor C6 is provided for decoupling any direct component. At the same time, said capacitor also forms the output 22 of the impedance transformer circuit 2.

In the present case, the matching network connected to the output 22 comprises a coil L7, a capacitor C8 connected in series, as well as a capacitor C7 arranged with a tap in between, the other terminal of which capacitor can be connected to the ground potential. The elements 51, 51a, 51b comprising reactances in an exemplary embodiment are realized as coils L8, L9 and L10. It is possible here to design the coils as air coils outside a semiconductor body, with the semiconductor body containing the power amplifier and the impedance inverter 2. Alternatively, the coils can also be designed as "drop-out lines" within the semiconductor body itself. Different lengths of metallic leads realize different inductances. The leads may be twisted together.

They can be switched into the signal path by the illustrated switching means 52, 52a and 52b, and consequently vary the overall impedance of the impedance transformer circuit. A first terminal "+" of the coils L8, L9 and L10 is connected for this purpose in each case to the common node 23. The respective second terminals "−" of the coils L8, L9 and L10 lead in each case to a first terminal of a pin diode V4, V3 and V2. The pin diodes are part of the switching means 52, 52a and 52b in each case. In addition to the diode, each of these switching means comprises four switching means 60 which function as logical switches and supply logical signals to both terminals of the diode irrespective of their switch position. In detail, a first terminal to the switching means 60 and 61 connects each diode. The second terminal of the diode is connected via a resistor 59 to two further switching means 62 and 63.

The switches 52a and 52b are constructed analogously. They also comprise four switching means 61a to 63a as well as 60b to 63b in each case.

The individual switching means serve to supply logical signals to the pin diodes V4, V3 and V2. For this they either switch the reference potential at the ground terminal 6, or the supply potential VC at the supply potential terminal 1VC to one terminal of the diode in each case. In detail, this is accomplished by switching the diode in the direction of flow. The current flowing across the diode is predetermined here by the resistors 59, 59a and 59b. In other words, the switch is closed when the diode is switched into the flow direction of the switch, and the associated coil is connected and its reactance is added to the output of the impedance transformer circuit. If the pin diodes are switched into the reverse direction, the coil connected thereto does not influence the output impedance of the impedance transformer circuit.

Figure 4:
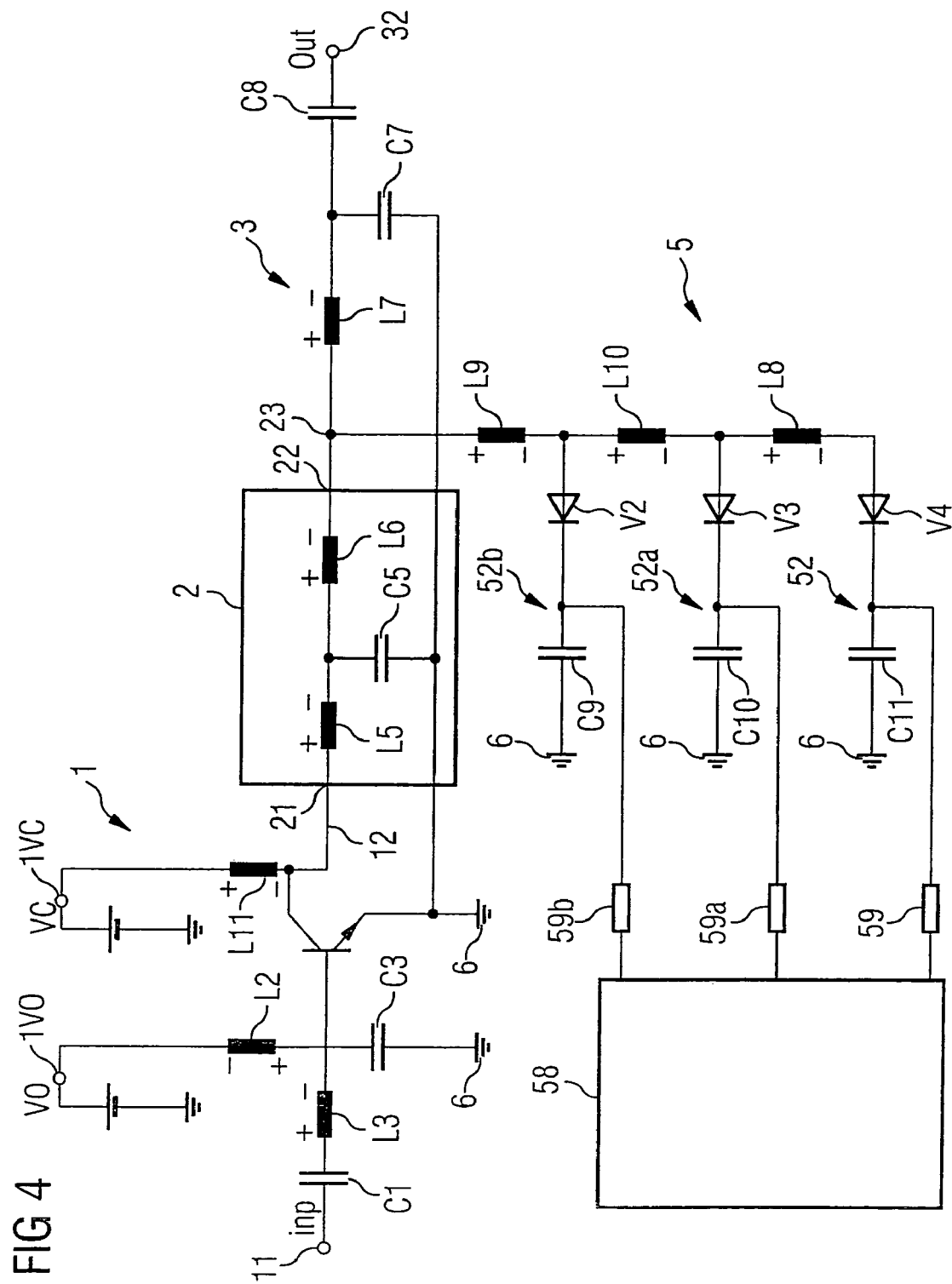
FIG. 4 shows a further exemplary embodiment of the invention.

FIG. 4 shows a further exemplary embodiment. In this form, the components having a reactance are likewise designed as coils L8, L9, L10. Moreover, the embodiment illustrated has the advantage that different reactances can be realized with a single inductor coil and suitable taps.

In this embodiment, the tap 23 is connected between the matching network 3 and the impedance transformer circuit 2 to a series circuit comprising a number of coils L9, L10 and L8. The coil L8 is connected by its second terminal to the diode V4. The second terminal of the diode V4 leads via a first capacitor C11 to the reference potential terminal 6, and via a resistor 59 to a control circuit 58. Provided between the coil L8 and L10 is a further tap connected to the second diode V3. Said diode is likewise connected by its second terminal to the control circuit 58 via a resistor 59a and to the ground potential terminal 6 via a capacitor C10. A tap and a diode V2 connected thereto are provided analogously between the coils L9 and L10.

The logic and control circuit 58 supplies a corresponding switching potential to the respective second terminals of the diodes 52 to 52b via the resistors 59, 59a and 59b. As a result, the individual diodes can be switched into the flow direction and consequently vary the reactance of the elements 5. By changing the reactance, the output impedance of the impedance transformer circuit 2 is also changed. A binary weighting of the change in the reactance is achieved here by suitable design and choice of taps between the coils L8, L10 and L9.

In addition to the embodiments of a switching arrangement employing pin diodes illustrated here, a corresponding selection and switching of the reactances can also be achieved by means of field effect transistors. In this case the diodes 52, 52a and 52b are replaced by field effect transistors in each case. The control terminals of said field effect transistors are then connected accordingly to the resistors 59, 59a and 59b respectively.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes ", "having ", "has ", "with ", or variants thereof are used in either the detailed description or the claims, such terms are intended to be inclusive in a manner similar to the term "comprising. "Also, the term "exemplary " is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

What is claimed is:

1. An amplifier arrangement, comprising:
   an adjustable amplifier comprising an adjustable amplification and an output;
   an impedance transformer circuit, comprising an input connected to the output of the adjustable amplifier, and an output configured to transform a high output impedance of the adjustable amplifier into a low impedance at the output of the impedance transformer circuit; and
   at least two switchable elements each comprising a reactance, wherein the switchable elements are each connected by a first terminal to the output of the impedance transformer circuit and are each connected by a second terminal to a reference potential terminal by a means for switching and wherein each switchable element is configured to change the impedance at the output of the impedance transformer circuit depending on a switch position of the means for switching.

2. The amplifier arrangement of claim 1, further comprising a matching network connected on an input side to the output of the impedance transformer circuit and the at least two switchable elements comprising a reactance.

3. The amplifier arrangement of claim 1, wherein the at least two switchable elements are arranged in parallel with one another.

4. The amplifier arrangement of claim 1, wherein the at least two switchable elements are arranged in series, with the second of the at least two elements being connected by the first terminal to the second terminal of the first of the at least two switchable elements.

5. The amplifier arrangement of claim 1, wherein the at least two switchable elements each comprise an inductive component which influences the impedance at the output of the impedance transformer circuit.

6. The amplifier arrangement of claim 1, wherein at least one of the at least two switchable elements further comprises a pin diode comprising a first terminal connected to a switch for supplying a potential and a second terminal connected to a component comprising the reactance.

7. The amplifier arrangement of claim 1, wherein the means for switching is configured to a transistor comprising a control terminal for supplying a switching signal for switching at least one of the at least two switchable elements.

8. The amplifier arrangement of claim 1, wherein the impedance transformer circuit comprises a first coil, a second coil connected in series, and a capacitor connected between the first and second coil by a first terminal and to a reference potential terminal by a second terminal.

9. An amplifier arrangement, comprising:
an adjustable amplifier with adjustable amplification comprising an output for outputting a signal;
an impedance transformer circuit, comprising an input connected to the output of the adjustable amplifier, and an output configured to transform a high output impedance of the adjustable amplifier into a low impedance at the output of the impedance transformer circuit;
at least one means for a reactance configured in a switchable manner to the output of the impedance transformer circuit.

10. The amplifier arrangement of claim 9, wherein the at least one means for a reactance comprises an inductive component configured to influence the impedance at the output of the impedance transformer circuit.

11. A method of signal amplification, comprising:
providing an amplifier comprising an output with an output impedance;
transforming the output impedance of the amplifier from a high output impedance to a low output impedance;
changing the low output impedance by adding or removing a reactance in response to a change of an amplifier setting of the amplifier, wherein the low output impedance is reduced if an average output power of the amplifier is reduced.

12. The method of claim 11, further comprising changing the changing the low output impedance by increasing the low output impedance by adding or removing a reactance, wherein the low output impedance is increased if an average output power of the amplifier is increased.

* * * * *